United States Patent [19]

Radas

[11] 4,411,356
[45] Oct. 25, 1983

[54] DEVICE FOR TRANSPORTING PRINTING PLATES

[75] Inventor: Adolf Radas, Frankfurt, Fed. Rep. of Germany

[73] Assignee: Hoechst Aktiengesellschaft, Frankfurt am Main, Fed. Rep. of Germany

[21] Appl. No.: 298,287

[22] Filed: Sep. 1, 1981

[30] Foreign Application Priority Data

Sep. 8, 1980 [DE] Fed. Rep. of Germany ....... 3033759

[51] Int. Cl.³ .............................................. B65G 25/00
[52] U.S. Cl. ..................................... 198/721; 198/739
[58] Field of Search ............. 198/739, 740, 485, 487, 198/750, 721; 271/269, 267, 84

[56] References Cited

U.S. PATENT DOCUMENTS

| | | | |
|---|---|---|---|
| 1,839,375 | 1/1932 | Covey | 198/487 X |
| 2,077,830 | 4/1937 | Failinger | 198/487 X |
| 3,578,316 | 5/1971 | Watson et al. | 271/267 |
| 3,747,781 | 7/1973 | Dengle et al. | 198/466 |
| 4,076,436 | 1/1978 | Davies et al. | 198/487 X |

FOREIGN PATENT DOCUMENTS 1807499 5/1970 Fed. Rep. of Germany .
1362323 8/1974 United Kingdom .

*Primary Examiner*—John J. Love
*Assistant Examiner*—Paul A. Sobel
*Attorney, Agent, or Firm*—Schwartz, Jeffery, Schwaab, Mack, Blumenthal & Koch

[57] ABSTRACT

Disclosed is a device for transporting printing plates in a processing unit, in which the printing plates are brought from a starting position into a final position on a processing table. The device comprises a pneumatically operated cylinder 2 located above the plane in which the printing plate 8 rests in its starting position on the processing table 1, and at least one pusher-element 7 attached to the actuating rod 5 of cylinder 2, the rod being capable of extension and retraction in the longitudinal direction of the unit. The pusher-element transports the printing plate from the starting position into the final position. In addition, a device 9–11 is provided for raising the pusher-element 7 from a level below the transport plane of the printing plate 8 to a level above the transport plane of the printing plate 8, and for lowering the element in the opposite sense, and a switch $S_6$ is provided, which is to be operated by the end of the pringting plate when the final position is reached and which initiates the reversal of the movement of the actuating rod 5. The device 9–11 for raising and lowering the pusher-element 7 is preferably also a pneumatically operated cylinder 9. A second switch $S_{18}$ is preferably provided, which is operated by the trailing end of the printing plate when the starting position is reached. This switch initiates the lowering of the pusher-element 7, and the movement of the actuating rod 5 of the cylinder 2 in the transport direction of the printing plate 8, following admission of compressed air to the actuator 2, via a delayed-action valve ZV1.

7 Claims, 3 Drawing Figures

DEVICE FOR TRANSPORTING PRINTING PLATES

BACKGROUND OF THE INVENTION

The present invention relates to a device for transporting printing plates in a processing unit, in which the printing plates in the processing station in question are brought from a starting position into a final position on a processing table.

The device is especially suitable for processing units in which printing plates carrying information in the form of script and images, which plates are suitable for use directly in the printing process, are produced by applying an electrostatic charge to the printing plate, projecting an original image-wise onto the printing plate, and developing, fixing, and decoating the printing plate. In order to carry out these process steps, the printing plate passes through the respective processing stations. In individual stations, such as, for example, the exposing station, or the developing station, the printing plate rests on a processing table which forms a chamber and which possesses a number of holes in its upper surface. The chamber is connected to a vacuum pump, via a suction line. In this way, the printing plate which is resting on the processing table is firmly held on the latter by generating a suction within the chamber during the processing. After a termination of the processing step in question, the printing plate is transported to the next processing station.

A device for transporting printing plates, which are stacked in a magazine, to an exposing station, and for positioning the plates, is described in German Patent Application No. P 30 25 201.8. This device has a movable actuator which possesses suction-elements on its extendable and retractable actuating rod, by means of which the printing plates are transported from a magazine standing at right angles to the transport direction, to a gripping device which is open in the upward direction. The gripping device rotates the printing plates into the horizontal attitude and transports them toward the exposing station. However, this device is unsuitable for pushing a printing plate which is already in the horizontal attitude on a processing table from a starting position into a desired final position, in the course of which movement that end of the printing plate which points in the transport direction always reaches the same final position, irrespective of the printing plate format.

SUMMARY OF THE INVENTION

The object of the present invention is to provide an improved device for transporting printing plates of the general type described in the introduction to the specification.

It is a further object of the invention to provide such a device by means of which those ends of the printing plates which point in the transport direction always reach the same final position, irrespective of the format of the printing plates.

Another object of the invention resides in providing such a device wherein the processing table, including its lateral regions, is kept free from transport elements, and the pneumatic system for transporting the printing plates, which is already available in processing units for printing plates, is utilized.

In accomplishing the foregoing objects, there has been provided in accordance with the present invention a device for transporting printing plates in a processing unit, in which the printing plates are brought from a starting position into a final position on a processing table, comprising a pneumatically operated first actuator located above the plane in which the printing plate rests in its starting position on the processing table, this first actuator having an actuating rod capable of extension and retraction in the longitudinal direction of the unit; at least one pusher-element attached to the actuating rod for transporting the printing plate from the starting position into the final position when the first actuator is operated; means for raising the pusher-element from a level beneath the transport plane of the printing plate to a level above the transport plane of the printing plate and for lowering the pusher-element in the opposite sense; and a switch operated by one end of the printing plate when the final position is reached for initiating the reversal of the movement of said actuating rod.

Further objects, features and advantages of the invention will become apparent from the detailed description of preferred embodiments which follows, when considered together with the attached figures of drawing.

DETAILED DESCRIPTION OF PREFERRED EMBODIMENTS

Figure 1:
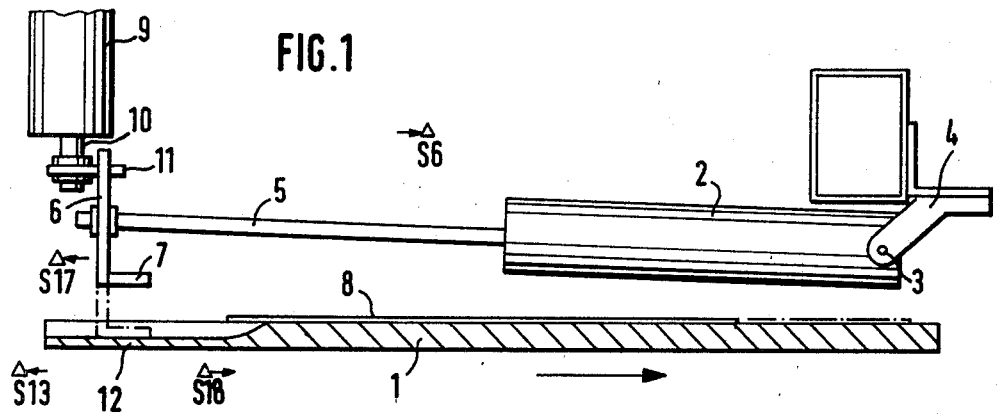
FIG. 1 is a side view of an illustrative embodiment of the device according to the invention.

The device according to the present invention is particularly suitable for a developing station, in which the printing plate is conveyed into the starting position on the developing table by means of any desired transport device. After the printing plate has been brought into the final position on the developing table by means of the device according to the invention, suction is applied to the developing table and the printing plate is transported with the developing table through the developing station while held to the table by suction.

Before the printing plate is brought into the starting position, the raising and lowering device raises the pusher-element to a level above the transport plane of the printing plate, so that the latter can be transported without obstruction into the starting position. After the printing plate has reached the starting position, the raising and lowering device lowers the pusher-element to a level below the transport plane of the printing plate, so that the pusher-element comes into engagement with the printing plate when the movement of the actuating rod in the transport direction of the printing plate begins.

The pusher-element can be attached to the extendable and retractable actuating rod in a manner permitting movement in the vertical direction, so that it can be moved in the vertical direction by the raising and lowering device without any change in the vertical position of the actuating rod and the actuator cylinder.

In a preferred embodiment, the pusher-element is, however, fastened to the actuating rod in a manner not permitting movement, and the actuator cylinder is mounted so that it can rotate about a shaft running transversely to the transport direction of the printing plate. In this case, on operating the raising and lowering device, the actuator cylinder and actuating rod are rotated, with the pusher-element, by a corresponding amount about the shaft.

A front plate is preferably provided on the actuating rod, this plate carrying on both its sides pusher-elements designed in the form of angle-pieces. There is, in addition, an opening in the front plate, into which the raising and lowering device engages when the actuating rod is moved toward this device.

A first switch, which is intended to be operated by the end of the printing plate when the final position is reached, can be located at the point at which that end of the printing plate which points in the transport direction should rest when the final position is reached, and the switch is operated by that end of the printing plate. In this case, the switch is installed at a fixed point, irrespective of the length of the printing plate. However, the switch can also be operated by the trailing end of the printing plate. In this case, the switch is installed in a manner permitting movement and, on setting the printing plate length on the unit, the switch is automatically shifted, in the case of relatively short printing plates, in the transport direction of the unit, or, in the case of relatively long printing plates, it is correspondingly shifted in the direction opposite to the transport direction. In both cases, that end of the printing plate which points in the transport direction always reaches the same final position, irrespective of the format.

In a preferred embodiment, the device for raising and lowering the pusher-element is a second pneumatically operated actuator cylinder.

As already mentioned above, the printing plate can be conveyed into the starting position by any desired means of transport. Provided that it runs only when it is conveying a printing plate, this means of transport can control the raising and lowering device, as well as the first actuator cylinder. It is thus possible, by switching off the means of transport, that is to say, when the printing plate has reached the starting position on the processing table, to operate the raising and lowering device, whereby the pusher-element is lowered to the level below the transport plane of the printing plate, and the movement of the actuating rod in the transport direction of the printing plate is started. As a result of this movement the pusher-element engages with the printing plate and pushes the latter into the final position. After the movement of the actuating rod has been reversed into the opposite direction by operating the first switch, by means of the end of the printing plate, the pusher-element once again engages with the raising and lowering device. On activating the means of transport, which brings the next printing plate into the starting position, the raising and lowering device is operated, whereby the pusher-element is raised and the transport path is cleared for this next printing plate.

In a preferred embodiment, however, switches are provided which are operated by the printing plate or by the pusher-element, or other parts on the actuating rod, and which trigger the device for raising and lowering the pusher-element, as well as the beginning and the end of the movement of the actuating rod. In the text which follows, these actions are explained in more detail by reference to the exemplary embodiment and to the drawing illustrating same.

The actuator cylinder 2 is located above the developing table 1, which can be moved backward and forward in the longitudinal direction of the unit. This actuator cylinder is held by a retaining device 4, so that it can rotate about the shaft 3. A front plate 6 is fastened to the leading end of the actuating rod 5, and pusher-elements 7, in the form of angle-pieces, are attached to both sides of the front plate 6. The legs of the angle-pieces extend parallel to the transport direction of the printing plate (compare arrow in FIG. 1) and point toward that end of the printing plate which is to be pushed. A second actuator cylinder 9 (only partially illustrated in FIG. 1) is located above the region in which the front plate 6 is situated before being moved by the retracting actuating rod 5 toward the printing plate 8 which is situated in the starting position. The actuating rod 10 of this actuator cylinder 9 possesses an arm 11 which points in the transport direction of the printing plate and engages into an opening in the front plate 6 when the latter is moved toward the actuator cylinder 9 by means of the actuating rod 5. In FIG. 1, the printing plate 8 is illustrated in its starting position. The rear end of the printing plate projects beyond the developing table 1. Guides 12 for the pusher-elements 7 are attached to the developing table. In FIG. 1, the final position of the printing plate 8 is represented by a dash-dotted line.

The switch $S_6$ is arranged so that it can be shifted. It is shifted into the appropriate position when the printing plate format is set on the processing unit. In the case of printing plates which are longer than the printing plate 8 shown in FIG. 1, the switch is shifted into a position which lies further to the left than the position shown in FIG. 1, while in the case of shorter printing plates, it is shifted into a position which lies further to the right. The switch $S_6$ is activated by the rear or trailing end of the printing plate and reverses the movement of the actuating rod 5.

A switch $S_{17}$ is located at a fixed point beneath the actuator cylinder 9. When switch $S_{17}$ is operated by the front plate 6, the movement of the actuating rod 5 of the actuator cylinder 2 opposite to the transport direction of the printing plate is halted, and the actuating rod 10 of the actuator cylinder 9 is retracted, as a result of which the front plate 6 is raised, together with the pusher-elements 7, into the position shown by solid lines in FIG. 1.

A switch $S_{18}$ is located at a fixed point beneath the transport plane of the printing plate 8. When this switch is operated by the rear end of the printing plate, the actuating rod 10 of the actuator cylinder 9 is extended, and the front plate 6, together with the pusher-elements 7, is thereby lowered into the position shown by dash-dotted lines in FIG. 1. At the same time, by operating the switch $S_{18}$, the actuating rod 5 of the actuator cylinder 2 is, after expiration of a time t, retracted, and the printing plate 8 is thereby transported into the desired final position by means of the pusher-elements 7.

Figure 3:
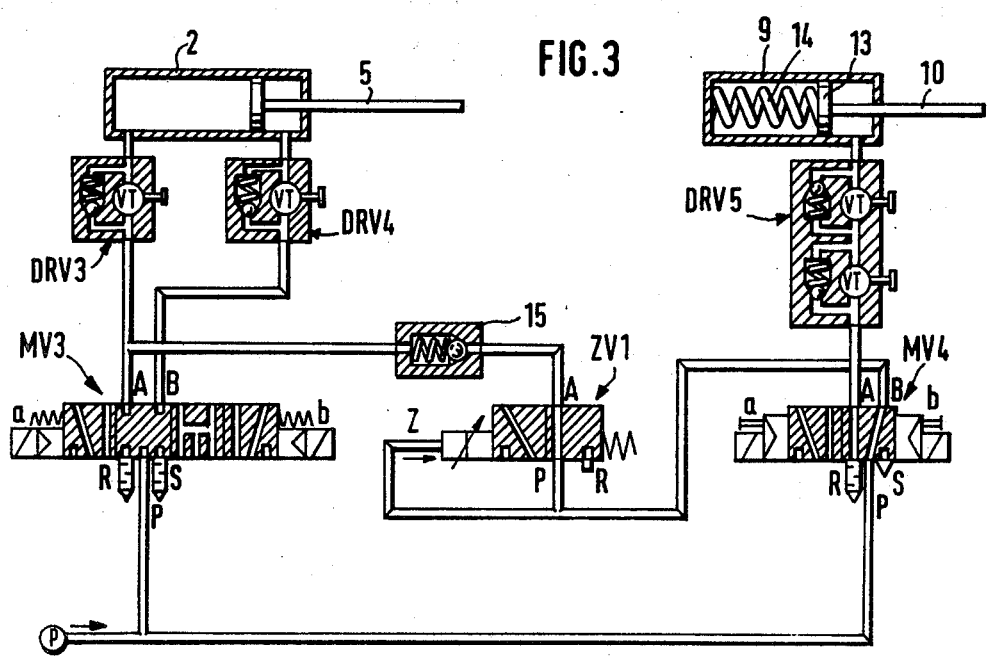
FIG. 3 is a circuit diagram of the compressed air supply system of the illustrative embodiment shown in FIG. 1.

In FIG. 3, the compressed air supply lines are marked P. The solenoid-valve MV3 for the actuator cylinder 2 has four positions. The first position (from the left in FIG. 3) is obtained on applying a voltage to the electric valve MV3a, the second position is obtained when no voltage is applied to the electric valves MV3a and MV3b (the position of the solenoid-valve MV3 as shown in FIG. 3), the third position is obtained on applying a voltage to both the electric valves MV3a and MV3b, and the fourth position is obtained on applying a voltage to the electric valve MV3b. One-way restrictors DRV3 and DRV4 are provided, in each case, between the connections A and B and the chambers of the actuator cylinder 2. Venting ports are marked R and S.

The pulse-operated solenoid-valve MV4 for the actuator cylinder 9 has two positions. The first position is obtained on applying a voltage pulse to the electric valve MV4a, and the second position (the position of the pulse-operated solenoid-valve MV4 as shown in FIG. 3) is obtained on applying a voltage pulse to the electric valve MV4b. In the latter position, the venting port S is closed. The connection to the actuator cylinder 9 is marked A, and the one-way restrictor assigned to the actuator cylinder 9 is marked DRV5. The piston 13 of the actuator cylinder 9 is supported against a spring 14.

A delayed-action valve ZV1 is provided between the connection B at the pulse-operated solenoid-valve MV4, and the line between connection A at the solenoid-valve MV3 and the one-way restrictor DRV3. This delayed-action valve has two positions. In the position shown in FIG. 3, connection B of the pulse-operated solenoid-valve MV4 is connected, via the delayed-action valve ZV1, to the line between connection A at the solenoid-valve MV3 and the one-way restrictor DRV3. In the second position, the connection is interrupted, since the venting port R is closed. A ball-type check valve 15 is provided in the line from connection A of the delayed-action valve ZV1 to the actuator cylinder 2.

In the text which follows, the mode of operation of the device according to the invention is described with reference to FIGS. 1 to 3.

The sequence of actions described below occurs only if the complete unit has been switched off and switched on again. In this case, a voltage is applied to the electric valve MV3a, and the solenoid-valve MV3 is consequently in its first position (from the left). The pressure line P is connected to the connection A, and the connection B is connected to the venting port S. The actuating rod 5 consequently extends toward the actuator cylinder 9. When the front plate 6 of the actuating rod 5 reaches the position shown by a dash-dotted line in FIG. 1, it engages with the arm 11 on the actuating rod 10 of the actuator cylinder 9 and, furthermore, operates the switch $S_{17}$. The voltage applied to the electric valve MV3a is thereby switched off, the solenoid-valve MV3 switches into the position shown in FIG. 3, that is to say, the valve-passages are blocked, and the movement of the actuating rod 5 is halted. Furthermore, through operating the switch $S_{17}$, a voltage pulse occurs at the electric valve MV4a, whereby the pulse-operated solenoid-valve MV4 is switched into the left position. The pressure line P is then connected to the connection A, compressed air is admitted to the actuator cylinder 9, and the actuating rod 10 is thereby retracted, preloading the spring 14. The front plate 6, connected with the pusher-elements 7, is engaged with the arm 11 and is raised during the retraction of the actuating rod 10, with the actuator cylinder 2 being rotated about the shaft 3. This position of the actuator cylinders 2 and 9 and of the front plate 6 with the pusher-elements 7 is shown in FIG. 1. The transport path for the printing plate is clear. At the same time as the processing unit is switched on, the developing table 1 is moved opposite to the transport direction of the printing plate. When the developing table 1 operates the switch $S_{13}$, the developing table ceases to move and has the position shown in FIG. 1.

The sequence of events so far described applies only if the unit is switched on.

The sequence of events described below repeats itself whenever printing plates are introduced into the unit. A printing plate 8, introduced into the processing unit, is transported from the exposing station, beneath the pusher-elements 7, into the position shown in FIG. 1, by means of transport device (not shown) used for this purpose. A switch $S_{18}$ is activated when it is cleared by the printing plate 8, that is to say, when the trailing end of the printing plate 8 has passed the switch $S_{18}$. Operation of the switch $S_{18}$ triggers a voltage pulse at the electric valve MV4b, whereby the pulse-operated solenoid-valve MV4 is switched into the position shown in FIG. 3. The compressed air thereby escapes from the actuator cylinder 9 via the venting port R. The stressed spring 14 presses against the piston 13 of the actuator cylinder 9, as a result of which the actuating rod 10 extends, and the front plate 6 together with the pusher-elements 7 is consequently lowered into the position shown with dash-dotted lines in FIG. 1. The pusher-elements 7 rest on the guides 12 on the developing table 1. When the pulse-operated solenoid-valve MV4 is switched into the position shown in FIG. 3, the delayed-action valve ZV1 is simultaneously switched into the position shown in FIG. 3. The pressure line P is thereby connected, via the delayed-action valve ZV1, to the line between connection A at the solenoid-valve MV3 and the one-way restrictor DRV3. Compressed air is admitted to the left-hand chamber of the actuator cylinder 2. After a certain time, if the pressure set at the delayed-action valve ZV1 is achieved by supplying compressed air via the line Z, the delayed-action valve ZV1 switches into the left position, as a result of which the supply of compressed air to the actuator cylinder 2, via the pulse-operated solenoid-valve MV4, is interrupted, and the connection A of the delayed-action valve ZV1 is closed by means of the closed venting port R.

Even if no printing plate has been introduced into the unit for a relatively long time, the consequent loss of pressure in the actuator cylinder 2 is prevented by means of the delayed-action valve ZV1, and an adequate air-cushion is always present, against which the actuating rod 5 is moved by means of the piston, when a new printing plate 8 is transported from the starting position into the final position. Uneven movement of the printing plate, which would not allow accurate positioning in the final position, is consequently avoided.

Upon expiration of a specified time t subsequent to the operation of the switch $S_{18}$, a voltage is applied to the electric valve MV3b, whereby the solenoid-valve MV3 is switched into the fourth position (right position). In this position, the supply line P for compressed air is connected to the connection B at the solenoid-valve MV3, while the connection A is connected to the venting port R. Compressed air is supplied, via the one-way restrictor DRV4, to the actuator cylinder 2, and the actuating rod 5 moves against the air-cushion in the left-hand chamber of the cylinder 2, as a result of which, as already explained above, smooth operation of the actuator is guaranteed. As the actuating rod 5 is retracted, the front plate 6, together with the pusher-elements 7, is moved toward the printing plate 8. The pusher-elements 7 slide up onto the guides 12, as a result of which the horizontal legs of the pusher-elements 7 slide under the end of the printing plate, which then rests on them. The printing plate is pushed into the position shown by means of the dash-dotted lines in FIG. 1.

The switch $S_6$ has previously been shifted into the appropriate position by setting the printing plate length on the unit. When the trailing end of the printing plate 8 clears the switch $S_6$, the latter is operated. The voltage applied to the electric valve MV3b is thereby switched off, and a voltage is applied to the electric valve MV3a. The solenoid-valve MV3 is switched into the first position, as a result of which the movement of the actuating rod 5 is reversed. The actuating rod 5 extends, whereby the front plate 6 together with the pusher-element 7 is moved opposite to the transport direction of the printing plate 8. The pusher-elements 7 thereby slide out from under the rear end of the printing plate, and the latter rests in the position drawn with broken lines. Suction is applied to the developing table 1, and the printing plate 8 is held by the suction.

When the front plate 6 reaches the switch $S_{17}$ and operates this switch, the voltage applied to the electric valve MV3a is switched off, and since no voltage is applied to the two valves MV3a and MV3b, the solenoid-valve MV3 is switched into the position shown in FIG. 3, in which the valve-passages are blocked. The actuating rod 5 ceases to move. At the same time, operation of the switch $S_{17}$ causes a voltage pulse to be applied to the electric valve MV4a, whereby the solenoid-valve MV4 is switched into the left position, in which compressed air is admitted to the actuator cylinder 9, the actuating rod 10 retracts, and the front plate 6, which had come into engagement with the arm 11 on the actuating rod 10 during the movement toward the switch $S_{17}$, is raised. The front plate 6, the pusher-elements 7, and the actuator cylinder 2 again have the position shown in FIG. 1. The apparatus is ready for the introduction of the next printing plate, and the sequence of operations of the switch $S_{18}$ described above will be repeated.

The preceding printing plate, which is in the final position and is held on the developing table 1 by suction, is moved onward with the developing table 1 in the transport direction of the printing plate.

Figure 2:
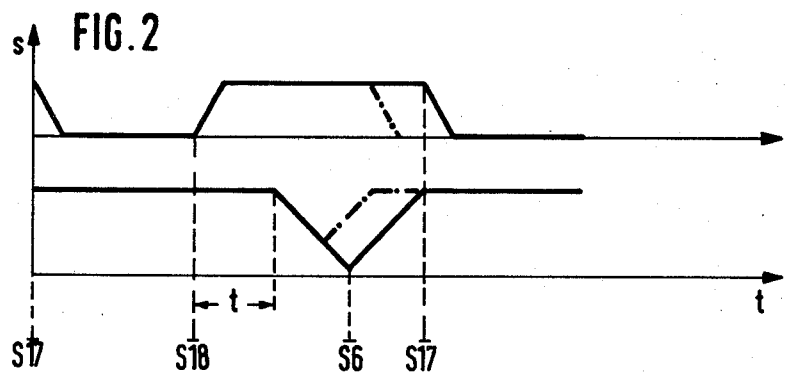
FIG. 2 is a diagram describing the chronological sequence of the movements of the actuating rods of the illustrative embodiment shown in FIG. 1.

In FIG. 2, the time is plotted against the extensions (s) executed by the actuating rods 5 and 10. The upper curve shows the sequence of movements for the actuating rod 10 of the actuator cylinder 9, whereas the lower curve shows the sequence of movements for the actuating rod 5 of the actuator cylinder 2. Before the switch $S_{18}$ is operated by the trailing end of the printing plate, the actuating rod 10 is in the retracted position and the actuating rod 5 is in the extended position (position of FIG. 1). When $S_{18}$ is operated, the actuating rod 10 is extended (position shown by dash-dotted lines in FIG. 1), and remains in this position until $S_{17}$ is operated by the front plate 6. After expiration of the time t, the actuating rod 5 is retracted, and, when the switch $S_6$ is operated by the trailing end of the printing plate, the movement is reversed, and the actuating rod 5 is extended again. When the switch $S_{17}$ is operated by the front plate 6, the actuating rod 10 is retracted, and the extension movement of the actuating rod 5 is terminated. The curves for the actuating rods 5 and 10, drawn in FIG. 2 with dash-dotted lines, show the sequence of actions in the case of a longer printing plate, that is to say, when $S_6$ is shifted to the left, and the movement of the actuating rod 5 is correspondingly reversed earlier. $S_{17}$ is then operated, likewise after a shorter time, by the front plate 6, and the extension movement of the actuating rod 5 is thereby terminated earlier, and the actuating rod 10 is retracted earlier.

What is claimed is:

1. A device for transporting printing plates in a processing unit, in which the printing plates are brought from a starting position into a final position on a processing table, comprising:
   a pneumatically operated, swiveling first actuator located above the plane in which the printing plate rests in its starting position on the processing table, said first actuator having an actuating rod capable of extension and retraction in the longitudinal direction of the processing unit;
   at least one pusher-element attached to said actuating rod for transporting the printing plate from the starting position into the final position when said first actuator is operated;
   means for raising said pusher-element from a level beneath the transport plane of the printing plate to a level above the transport plane of the printing plate and for lowering the said pusher-element in the opposite sense;
   a front plate fastened to said actuation rod, said front plate carrying said pusher elements on both lateral sides and having an opening into which said means for raising and lowering the pusher rod engages; and
   a switch operated by one end of the printing plate when the final position is reached for initiating the reversal of the movement of said actuating rod.

2. A device as claimed in claim 1, wherein the processing table is movable backward and forward in the longitudinal direction of the processing unit.

3. A device as claimed in claim 1, wherein said first actuator is mounted for rotation about a shaft running transversely to the transport direction of the printing plate.

4. A device as claimed in claim 3, wherein said raising and lowering means comprises a second pneumatically operated actuator having an actuating rod and an arm extending from the actuating rod of said second actuator for engagement with said front plate.

5. A device as claimed in claim 1, further comprising a second switch is operated by the trailing end of the printing plate when the starting position of the printing plate is reached, said second switch initiating the lowering of the pusher-element by means of said raising and lowering means and also initiating the movement of the actuating rod of said first actuator in the transport direction of the printing plate.

6. A device as claimed in claim 5, further comprising a delayed-action valve which is actuated in response to the operation of said second switch for admitting compressed air to said first actuator before movement of the actuating rod of said first actuator begins in the transport direction of the printing plate.

7. A device as claimed in claim 1, further comprising a third switch which is operated in response to movement of said pusher-element, the said third switch initiating termination of the movement of the actuating rod of said first actuator opposite to the transport direction of the printing plate, as well as initiating lifting of said pusher-element by means of said raising and lowering means.

* * * * *